(12) United States Patent
Spiegelman (10) Patent No.: US 7,618,027 B2
(45) Date of Patent: Nov. 17, 2009

(54) VAPORIZER FOR DELIVERY OF LOW VAPOR PRESSURE GASES

(75) Inventor: Jeffrey J. Spiegelman, Del Mar, CA (US)

(73) Assignee: Rasirc, San Diego, CA (US)

( * ) Notice: Subject to any disclaimer, the term of this patent is extended or adjusted under 35 U.S.C. 154(b) by 0 days.

(21) Appl. No.: 12/198,755

(22) Filed: Aug. 26, 2008

(65) Prior Publication Data
US 2009/0014901 A1    Jan. 15, 2009

Related U.S. Application Data (63) Continuation of application No. PCT/US2007/006775, filed on Mar. 19, 2007.

(60) Provisional application No. 60/784,382, filed on Mar. 20, 2006.

(51) Int. Cl.
*B01F 3/04*    (2006.01)

(52) U.S. Cl. .............. 261/130; 261/131; 261/104; 261/DIG. 65

(58) Field of Classification Search ............ 261/128, 261/129, 130, 131, 137, 104, 107, 154, 155, 261/157, DIG. 65; 118/715, 726
See application file for complete search history.

(56) References Cited

U.S. PATENT DOCUMENTS

| | | | |
|---|---|---|---|
| 7,156,380 B2 * | 1/2007 | Soininen | ............ 261/122.1 |
| 2004/0056368 A1 | 3/2004 | Hirahara et al. | |
| 2005/0066893 A1 | 3/2005 | Soininen | |
| 2006/0125129 A1 * | 6/2006 | Takamatsu et al. | ............ 261/142 |

* cited by examiner

*Primary Examiner*—Scott Bushey
(74) *Attorney, Agent, or Firm*—Knobbe, Martens, Olson & Bear LLP (57) ABSTRACT

A vaporizing device is provided for control, delivery, and purification of low vapor pressure gases in conjunction with carrier gas in micro-electronics and other critical applications.

26 Claims, 4 Drawing Sheets

VAPORIZER FOR DELIVERY OF LOW VAPOR PRESSURE GASES

CROSS-REFERENCE TO RELATED APPLICATIONS

This application is a continuation, under 35 U.S.C. § 120, of International Patent Application No. PCT/US2007/006775, filed on Mar. 19, 2007 under the Patent Cooperation Treaty (PCT), which was published by the International Bureau in English on Sep. 27, 2007, which designates the United States and claims the benefit of U.S. Provisional Application No. Ser. No. 60/784,382, filed Mar. 20, 2006, the disclosures of which are hereby expressly incorporated by reference in their entirety and are hereby expressly made a portion of this application.

FIELD OF THE INVENTION

A vaporizing device is provided for control, delivery, and purification of low vapor pressure gases in conjunction with carrier gas in micro-electronics and other critical process applications.

BACKGROUND OF THE INVENTION

Vapors of water and other liquids are used in many applications in current advanced technology processes, including processes employed in micro-electronics manufacturing, as well as in clean room and medical applications. Desirably, such vapors should introduce minimal impurities into a process, such that they can be used, e.g. for the oxidation of silicon, in the production of thin gate oxides (e.g. in the electronics and micro-electronics industries), and in ultra-high purity cleaning processes. However, delivery of liquid vapor (such as, e.g., water, alcohols, or amines) to a process using conventional methods is difficult, and the choices limited to direct liquid injection (DLI) or bubblers, each of which tend to introduce contaminants along with liquid vapor.

In the medical industries, water vapor can be used for humidification. Such water vapor when produced using conventional systems can yield a product having, e.g. prions, viruses, allergens, proteins, bacteria, and other biologically active macromolecules or substances present. Additionally, inorganic substances, such as borates and silicates or metallic substances such as iron, nickel, chromium, copper, and other toxic metals can be present.

Typically, water for micro-electronics applications is produced by reacting gaseous hydrogen and oxygen to yield water vapor. The production of pure water vapor is practically impossible due to the presence of residual oxygen and/or hydrogen remaining in the product water vapor. Removing these components often requires additional expensive and complex separation processes. Additionally, high concentrations of gaseous hydrogen are often required for the synthesis reaction with oxygen, which is conducted at high temperatures well above the explosive limit of hydrogen (approximately 8% at a pressure of approximately 100 kPa).

The simple boiling of high purity de-ionized water to yield water vapor can avoid the problems and dangers inherent in the direct reaction of hydrogen and oxygen to yield steam. However, removing dissolved gases can be difficult and often requires multiple boiling/condensation cycles in a hermetically sealed environment, which can be expensive. Moreover, aerosols containing materials that are not normally volatile, such as salts or metals, can be produced during the boiling process and can add unwanted impurities.

SUMMARY OF THE INVENTION

A method of producing liquid vapor entrained in a carrier gas, wherein the liquid vapor contains reduced levels of impurities, and wherein the liquid vapor can be delivered in a controlled manner over a variety of conditions is desirable. The vaporizer systems, devices, and methods of the preferred embodiments achieve these goals.

In a first aspect, a vaporizer device is provided, the device comprising a mass flow control device configured to control a flow rate of a carrier gas; and a vaporizer, wherein the vaporizer comprises: a source of a liquid, at least one temperature controller configured to control a temperature of at least one of the liquid and the carrier gas, and a membrane assembly configured to permit passage therethrough of the liquid but not the carrier gas, whereby the liquid passes through the membrane assembly to contact the carrier gas, thereby yielding a mixture of the source vapor in the carrier gas, wherein a concentration of the source vapor in the carrier gas is determined by the temperature of the source, the temperature of the carrier gas, and the flow rate of the carrier gas.

In an embodiment of the first aspect, the vaporizer device further comprises a level detection device for monitoring an amount of the source in the source chamber.

In an embodiment of the first aspect, the vaporizer device further comprises a pressure transducer for providing a feedback to the temperature controller.

In an embodiment of the first aspect, the vaporizer device further comprises a temperature transducer for providing a feedback to the temperature controller.

In an embodiment of the first aspect, the vaporizer device further comprises a humidity transducer for providing a feedback to the temperature controller.

In an embodiment of the first aspect, the vaporizer device further comprises a downstream pressure control device configured to control a pressure of the mixture of the source vapor in the carrier gas.

In an embodiment of the first aspect, the vaporizer device further comprises a thermal control device. The thermal control device can be configured to perform at least one of adding heat to the vapor source and removing heat from the vapor source, or to perform at least one of adding heat to the carrier gas and removing heat from the carrier gas.

In an embodiment of the first aspect, the vaporizer device further comprises a downstream pressure control device configured to control a ratio of vapor to carrier gas in the mixture.

In an embodiment of the first aspect, the vaporizer device further comprises a downstream pressure control device configured to deliver the mixture into a sub-atmospheric process.

In an embodiment of the first aspect, the membrane assembly comprises an ionic membrane, wherein the ionic membrane is configured to inhibit passage therethrough of at least one contaminant present in liquid.

In an embodiment of the first aspect, the membrane assembly comprises an ion exchange membrane comprising a perfluorinated ionomer.

In an embodiment of the first aspect, the membrane assembly comprises a fluoropolymer membrane containing sulfonic acid groups.

In an embodiment of the first aspect, the membrane assembly comprises a substantially gas-impermeable membrane having a leak rate of gases other than water vapor of less than about $10^{-3}$ $cm^3/cm^2/s$ under standard atmosphere and pressure.

In an embodiment of the first aspect, the membrane assembly comprises a substantially gas-impermeable membrane that is more permeable to water vapor than to other gases by a ratio of at least about 1,000:1.

In an embodiment of the first aspect, the vaporizer is configured to deliver vapor to the carrier gas at a controlled rate of about 18 micrograms per minute or less.

In an embodiment of the first aspect, the vaporizer is configured to deliver vapor to the carrier gas at a controlled rate of about 18 micrograms per minute to about 1 kilogram per minute.

In an embodiment of the first aspect, the vaporizer is configured to deliver vapor to the carrier gas at a controlled rate of about 1 kilogram per minute.

In an embodiment of the first aspect, the vaporizer device further comprises a back pressure regulator configured to deliver a low vapor pressure gas into a sub-atmospheric process.

In a second aspect, a method for producing a mixture of a vapor in a carrier gas is provided, the method comprising: contacting a source liquid at a preselected first temperature with a first side of a membrane, wherein the membrane permits the passage therethrough of the liquid; contacting a carrier gas at a preselected second temperature and a preselected flow rate with a second side of the membrane, wherein the membrane resists passage therethrough of the carrier gas; and contacting, at the second side of the membrane, carrier gas with liquid that has passed through the membrane, whereby a mixture of a source vapor at a preselected concentration in the carrier gas is generated.

In an embodiment of the second aspect, the carrier gas comprises a gas selected from the group consisting of hydrogen, oxygen, nitrogen, helium, argon, ozone, carbon dioxide, carbon monoxide, air, and mixtures thereof.

In an embodiment of the second aspect, the carrier gas is air.

In an embodiment of the second aspect, the carrier gas is hydrogen.

In an embodiment of the second aspect, the carrier gas is selected from the group consisting of a corrosive gas, a reactive gas, a hydrocarbon gas, a halogenated gas, and mixtures thereof.

In an embodiment of the second aspect, the source liquid is selected from the group consisting of water, liquid alcohol, liquid amine, and mixtures thereof.

In an embodiment of the second aspect, the source liquid is selected from the group consisting of water, methanol, isopropanol, and mixtures thereof.

In an embodiment of the second aspect, the source liquid is water.

In an embodiment of the second aspect, the source liquid is isopropanol.

In an embodiment of the second aspect, the membrane resists passage therethrough of at least one contaminant in the source liquid, such that the source vapor contains a lower concentration of the contaminant than the source liquid.

In an embodiment of the second aspect, the mixture comprises humidified air, and wherein the water vapor contains less than about 1 ppb of prions, viruses, allergens, proteins, bacteria, and other biologically active macromolecules.

In an embodiment of the second aspect, the water vapor contains less than about 1 ppb of borates, silicates, iron, nickel, chromium, and copper.

In an embodiment of the second aspect, a rate of delivery of vapor to the carrier gas is about 18 micrograms per minute or less.

In an embodiment of the second aspect, a rate of delivery of vapor to the carrier gas is from about 18 micrograms per minute to 1 kilogram per minute.

In an embodiment of the second aspect, a rate of delivery of vapor to the carrier gas is about 1 kilogram per minute or more.

In an embodiment of the second aspect, the method further comprises a step of delivering the mixture of the source vapor at the preselected concentration in the carrier gas into a sub-atmospheric process.

DETAILED DESCRIPTION OF THE PREFERRED EMBODIMENT

A pervaporation device for the control, delivery, and/or purification of water, isopropanol (IPA, also referred to as isopropyl alcohol), or other low vapor pressure gases into a carrier gas stream for micro-electronics applications is provided. The vaporizer enables the controlled transfer and/or purification of water, alcohols, or mixtures thereof directly into a carrier gas stream via a non-porous membrane. The vapor to be transferred is referred to as the "source," and the gas that is loaded with the vapor is referred to as the "carrier gas." By utilizing the temperature-vapor pressure curve of the source, the temperature of the carrier, the temperature of the source, and the flow rate of the carrier gas, the vapor can be precisely delivered.

Each liquid has a known vapor pressure for a given temperature. A gas that contacts a liquid will become saturated with this vapor. Water, for example, has a vapor pressure of 1 atmosphere at 100° C. The gas that results from contact of a carrier gas with a liquid is composed of a combination of the vapor and the carrier gas. Under ideal conditions, the mass of source vapor that are carried away by the carrier gas is equal to the mass flow rate of the carrier gas contacting the source times the vapor pressure of the source divided by the total system pressure less the vapor pressure of the source. For a given device and mass flow rates, this number can be fixed with precision if the temperature of the carrier gas and the liquid source, the system pressure, and carrier gas flow rate are tightly controlled.

There are number of ways by which this control can be accomplished. In a preferred embodiment, a non-porous membrane is employed to provide a barrier between the liquid source and the carrier gas. The molecules from the liquid source rapidly permeate across the membrane, while the carrier gas is excluded from diffusing across the membrane into the liquid. The source is diffusion driven by a concentration gradient between the liquid and the carrier gas. This flow stops once the carrier gas has been fully saturated to the resulting source vapor pressure for the specific temperature at the membrane.

Because the membrane is designed specifically to select only the source gas molecules, other contaminants in the liquid source cannot permeate across the membrane and cannot then enter into the carrier gas stream. The membrane excludes particles, micro-droplets, volatile gases, and other opposite-charged species. For example, a hydrophilic membrane can be employed to exclude hydrophobic gases, and a hydrophobic membrane can be employed to exclude hydrophilic gases.

Figure 1:
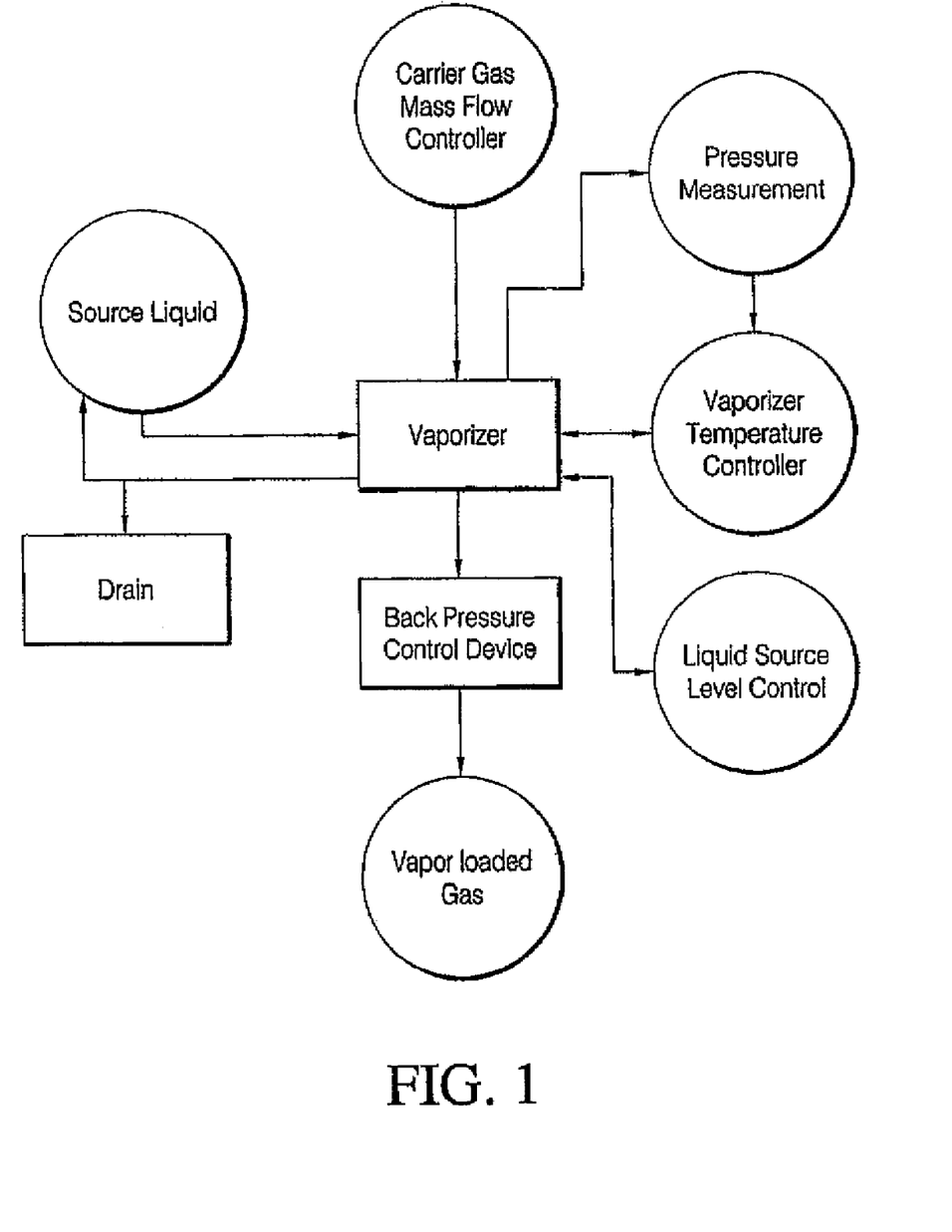
FIG. 1 provides a schematic depiction of a vaporizer device of a preferred embodiment.

In a preferred embodiment, the device includes the following components: a mass flow control device to control the flow of the carrier gas; and a vaporizer. The vaporizer typically includes, e.g., a source container, heating and/or cooling unit(s) to control the temperatures of the source and/or carrier gas, and a membrane assembly which permits the carrier gas to mix with the source, become saturated with the source vapor, and then exit the vaporizer without direct contact with the liquid. The vaporizer can optionally include a level detection device, pump, or other device for monitoring and/or controlling the amount of source liquid in the source container. The vaporizer can also optionally include a pressure transducer, humidity detector or temperature transducer for feedback to the temperature controller. If the device is employed to deliver vapor to a process operated at a pressure other than atmospheric, then the device preferably also includes a downstream pressure control device. FIG. 1 provides a schematic depiction of a vaporizer system of a preferred embodiment.

In a particularly preferred embodiment, the vaporizer device is configured for the transfer of water vapor. In this embodiment, a fluoropolymer membrane which contains sulfonic acid groups is preferably employed. Such membranes are commercially available under the tradename of NAFION® by E. I. du Pont de Nemours and Company, Wilmington, Del. Such membranes allow for the rapid transfer water vapor into a carrier gas, such as nitrogen, compressed clean dry air, forced ventilation air, helium, oxygen, or hydrogen. While the aforementioned carrier gases are particularly preferred, other carrier gases can also be employed. Suitable carrier gases can include $CO_2$, argon, ozone, corrosive or reactive gases as are employed in the micro-electronics industry, hydrocarbons (acetylene, 2,2-dimethylpropane, allene, ethane, 1,2-butadiene, ethyl acetylene, 1,3-butadiene, ethylene, isobutane, n-hexane, n-butane, methane, 1-butene, methyl acetylene, cis-2-butene, 2-methylbutane, 3-methylbutane, trans-2-butene, n-pentane, isobutylene, propane, cyclopropane, propylene, dimethylacetylene, toluene, dimethyl ether, vinyl acetylene), halogenated hydrocarbons (chloroform, trichloroethylene, halothane, methoxyflurane, fluoroxene, and enflurane, hydrochlorofluorocarbons, and hydrofluorocarbons), other halogenated gases such as sulfur hexafluoride, and the like.

The devices and systems of the preferred embodiments offer numerous advantages over prior art systems. Delivery of water or IPA to a process using conventional methods is difficult, and the choices are limited to direct liquid injection (DLI) or bubblers. DLI is costly and problematic for use with different flow rates. At low flow rates control has limited accuracy, and at high flow rates DLI is susceptible to bubbles in the liquid which generate erratic flow rate values. DLI utilizes a metallic vaporizer or a metal hot plate to convert the liquid to gas, and can vaporize only limited quantities of liquid due to thermal transfer rates. Other disadvantages to DLI are that contamination can build up on the hot plate, and there is a potential for chemical decomposition of certain liquids. The greatest disadvantage of DLI, however, is that it cannot provide any purification of the liquid being vaporized, since everything in the liquid, including contaminants and impurities, is vaporized and introduced into the process.

Bubblers have the advantage of low cost. However, bubblers are inaccurate and imprecise, due to poor control of the temperature of the gas, the temperature of the liquid, the operating pressure, the liquid level, and thermal droop. Bubblers offer somewhat better performance than DLI as to entrainment of contaminants, since bubblers leave behind some contamination during the vaporization process, but bubblers cannot prevent entrainment of dissolved gases, volatile molecular contaminants, and micro-droplets which can carry particulate and ionic molecular contaminants.

Membrane contactors can also be used to permit gas transfer between a liquid and gas; however, such contactors suffer from certain disadvantages. Membrane contactors are typically constructed from hollow fiber membranes which are porous. This configuration allows for the simultaneous transfer of the gas into the liquid and the liquid into the gas. Most hollow fiber membranes are hydrophobic and thus must be modified so as to be suitable for use with hydrophilic molecules. Some hollow fibers can be rendered hydrophilic by chemical modification, but in the case of surface treatments, such modification may only be partially effective, and may wet out to allow undesirable direct liquid transfer across the membrane. Because such membranes are porous, they have limited ability to provide purification or microdroplet permeation. Membrane contactors are not specific to which gases can permeate, and thus have no purification capability. They also allow the carrier gas to permeate into the liquid source. This can be problematic if the carrier gas is pyrophoric or toxic.

In contrast to the prior art methods of adding vapor to a carrier gas, the vaporizer devices of preferred embodiments permit purified vapor to be added in a controlled fashion to a carrier gas. Vapor levels as low 18 micrograms per minute or lower can be delivered. Very high flow rates of up to 1 kilogram per minute or more can also be delivered into most gases, including hydrogen. The non-porous membrane prevents dissolved gases, most volatile contaminants, particles, and microdroplets from being transferred into the carrier gas, such that the saturated product is more consistent in composition and significantly more pure. Because it works on the basis of 100% saturation of the carrier gas, the vaporizer device can be cycled on and off without a significant effect on accuracy. With a properly sized membrane surface area, saturation values of greater than 95% are possible (e.g., 96%, 97%, 98%, 99% or even 100%). As the carrier gas flow rate increases for a given surface area, a saturation value below 100% can be obtained. With increasing carrier gas flow rate, the amount of vapor declines from 100% relative humidity to less than 1% relative humidity. Accordingly, by adjusting the carrier gas flow rate, the percent saturation can be precisely controlled. The saturation levels are repeatable and based on the control system parameters, and can typically be controlled to a variation of 10% or less, 5% or less, or even 1% or less.

The Membrane

In a preferred embodiment, water or other vapor is introduced into a carrier gas through a substantially gas-impermeable ionic exchange membrane. The term "substantially gas-impermeable membrane" as used herein is a broad term, and is to be given its ordinary and customary meaning to a person of ordinary skill in the art (and is not to be limited to a special or customized meaning), and refers without limitation to a membrane that is permeable to water vapor but relatively impermeable to other gases such as, but not limited to, hydrogen, nitrogen, oxygen, carbon monoxide, carbon dioxide, hydrogen sulfide, hydrocarbons (e.g. ethylene), volatile acids and bases, refractory compounds, and volatile organic compounds. Gas impermeability can be determined by the "leak rate" of the membrane. The term "leak rate" as used herein is a broad term, and is to be given its ordinary and customary meaning to a person of ordinary skill in the art (and is not to be limited to a special or customized meaning), and refers without limitation to the volume of a particular gas that penetrates the membrane surface area per unit of time. For example, a substantially gas-impermeable membrane could have a low leak rate of gases other than water vapor, such as a leak rate of less than about $10^{-3}$ cm$^3$/cm$^2$/s under standard atmosphere and pressure. Alternatively, a "substantially gas-impermeable" membrane can be identified by a ratio of the permeability of water vapor compared to the permeability of other gases. Preferably, the substantially gas-impermeable membrane is more permeable to water vapor than to other gases by a ratio of at least about 10,000:1, such as a ratio of at least about 20,000:1, 30,000:1, 40,000:1, 50,000:1, 60,000:1, 70,000:1, 80,000:1, 90,000:1 or a ratio of at least about 100,000:1, 200,000:1, 300,000:1, 400,000:1, 500,000:1, 600,000:1, 700,000:1, 800,000:1, 900,000:1 or even a ratio of at least about 1,000,000:1. However, in other embodiments, other ratios that are less than 10,000:1 can be acceptable, for example, 1.5:1, 2:1, 3:1, 4:1, 5:1, 6:1, 7:1, 8:1, 9:1, 10:1; 50:1, 100:1, 500:1, 1,000:1, or 5,000:1 or more.

The term "ion exchange membrane" as used herein is a broad term, and is to be given its ordinary and customary meaning to a person of ordinary skill in the art (and is not to be limited to a special or customized meaning), and refers without limitation to a membrane comprising chemical groups capable of combining with ions or exchanging ions between the membrane and an external substance. Such chemical groups include, but are not limited to, sulfonic acid, carboxylic acid, phosphoric acid, phosphinic acid, arsenic groups, selenic groups, phenol groups, and salts thereof. The chemical groups can be in a salt form or an acid form where the cations or protons are exchangeable with other cations from an external source, e.g. a solution or gas. Ion exchange membranes can be provided in acid form and converted to salt forms by pretreating the membrane with a base, such as an alkali metal base, e.g. sodium hydroxide, potassium hydroxide, sodium carbonate, sodium hydrogen carbonate, potassium carbonate or potassium hydrogen carbonate lithium hydroxide, or an alkaline earth metal bases, e.g. calcium hydroxide, calcium oxide, magnesium hydroxide or magnesium carbonate.

In one embodiment, the ion exchange membrane is a resin, such as a polymer containing exchangeable ions. Preferably, the ion exchange membrane is a fluorine-containing polymer, e.g. polyvinylidenefluoride, polytetrafluoroethylene (PTFE), ethylene tetrafluoride-propylene hexafluoride copolymers (FEP), ethylene tetrafluoride-perfluoroalkoxyethylene copolymers (PFE), polychlorotrifluoroethylene (PCTFE), ethylene tetrafluorideethylene copolymers (ETFE), polyvinylidene fluoride, polyvinyl fluoride, vinylidene fluoride-trifluorinated ethylene chloride copolymers, vinylidene fluoride-propylene hexafluoride copolymers, vinylidene fluoridepropylene hexafluoride-ethylene tetrafluoride terpolymers, ethylene tetrafluoride-propylene rubber, and fluorinated thermoplastic elastomers. Alternatively, the resin comprises a composite or a mixture of polymers, or a mixture of polymers and other components, to provide a contiguous membrane material. In certain embodiments, the membrane material can comprise two or more layers. The different layers can have the same or different properties, e.g. chemical composition, porosity, permeability, thickness, and the like. In certain embodiments, it can also be desirable to employ a layer (e.g. a membrane) that provides support to the filtration membrane, or possesses some other desirable property.

The ion exchange membrane is preferably a perfluorinated ionomer comprising a copolymer of ethylene and a vinyl monomer containing an acid group or salts thereof. Exemplary perfluorinated ionomers include, but are not limited to, perfluorosulfonic acid/tetraafluoroethylene copolymers ("PFSA-TFE copolymer") and perfluorocarboxylic acid/tetrafluoroethylene copolymer ("PFCA-TFE copolymer"). These membranes are commercially available under the tradenames NAFION® (E.I. du Pont de Nemours & Company), FLEMION® (Asahi Glass Company, Ltd.), and ACIPLEX® (Asahi Chemical Industry Company).

Tetrafluoroethylene

Perfluoro(4-Methyl-3,6-Dioxa-7-Octene-1 Sulfonic Acid)

PFSA-TFE Copolymer in the Hydrolyzed Sulfonic Acid Form

A PFSA-TFE copolymer contains a tetrafluoroethylene (TFE) "backbone" to which perfluorosulfonic acid (perfluoro (4-methyl-3,6-dioxa-7-octene-1-sulfonic acid)) groups are attached. There can be one, two, three, four, five, or six perfluorosulfonic acid groups for every six TFE backbone units. Any suitable molecular weight polymer can be employed. Preferably, a polymer having a molecular weight from about 500 MW or less to about 2000 MW or more or more is employed. The molecular weight can also be from about 600, 700, 800, or 900 MW to about 1000, 1100, 1200, 1300, 1400, 1500, 1600, 1700, 1800, or 1900 MW. The molecular weight can even be from about 910, 920, 930, 940, 950, 960, 970, 980, or 990 MW to about 1000, 1010, 1020, 1030, 1040, 1050, 1060, 1070, 1080 or 1090 MW. A single copolymer can be employed, or combinations of two or more different copolymers (e.g. varying in chemical composition, molecular weight, or other property) can be employed. A copolymer having a single peak molecular weight is generally preferred; however, in certain embodiments it can be preferred to employ a polymer with a bimodal or multimodal molecular weight distribution, with varying amounts of polymer chains having different molecular weights. The copolymers can be in any configuration, e.g. block, tapered, random, linear, branched, and/or crosslinked.

Chemical Structure of a PFCA-TFE Copolymer in the Hydrolyzed Carboxylic Acid Form PFCA-TFE copolymers contain a tetrafluoroethylene (TFE) "backbone," to which the perfluorocarboxylic acid (perfluoro(4-methyl-3,6-dioxa-7-octene-1-carboxylic acid)) groups are attached. PFSA-TFE copolymers and PFCA-TFE copolymers can be converted to the salt form by pretreatment with a suitable base, such as an alkali metal base (e.g. as described above). Such pretreatment processes of ion exchange membranes are well known in the art and can be performed, for example, in accordance with the manufacturer's recommendations. Depending upon the nature of the source (e.g. impurities, impurity levels) and the resulting water vapor desired, the pretreatment conditions can be adjusted to yield an optimized membrane. For example, the selection of base, solvents used, temperature, exposure time, rinse conditions, extent of ion exchange (e.g. 10% or less to 90% or more) can be adjusted. It can also be desirable to adjust the hydrophilicity of the resulting membrane by crosslinking it with a hydrophilic agent, or co-casting the polymer with a hydrophilic component. In such embodiments, the polymer already includes crosslinkable groups, or is functionalized to include crosslinkable groups. Other forms of pretreatment can also be employed (e.g., reaction with agents to modify the surface morphology of the polymer (roughen, increase or decrease porosity, etc.), without modifying the surface chemistry.

Preferably, the membrane is a substantially gas-impermeable perfluorinated ionomer (e.g., a NAFION® membrane). The permeability of water vapor is greater than three orders of magnitude larger than the permeability of $CO_2$ or CO through a NAFION® membrane, and approximately six orders of magnitude greater than the permeability of oxygen or nitrogen. Hydrogen diffusion can be effectively suppressed through a NAFION® membrane, while permitting passage of water vapor. The substantially gas-impermeable membrane is preferably substantially nonporous. The substantially gas impermeable membranes can suppress the diffusion of gases and other materials, such as particles, aerosols, viruses, bacteria, prions, metals, ions, and other airborne molecular contaminants.

In preparing a vapor saturated carrier gas stream, a source is passed through the membrane. The term "passing a source through a membrane" as used herein is a broad term, and is to be given its ordinary and customary meaning to a person of ordinary skill in the art (and is not to be limited to a special or customized meaning), and refers without limitation to contacting a first side of a membrane with the source, such that the source's molecules (water or another liquid's molecules) pass through the membrane, and obtaining a source's vapor on the opposite side of the membrane. The first and second sides can have the form of substantially flat, opposing planar areas, where the membrane is a sheet. Membranes can also be provided in tubular or cylindrical form where one surface forms the inner portion of the tube and an opposing surface lies on the outer surface. One of ordinary skill in the art can readily appreciate that the membrane can take any form, so long as a first surface and an opposing second surface sandwich a bulk of membrane material. Depending upon the processing conditions, nature of the source, volume of liquid vapor to be generated, and other factors, the properties of the membrane can be adjusted. Properties include, but are not limited to physical form (e.g. thickness, surface area, shape, length and width for sheet form, diameter if in fiber form), configuration (flat sheet(s), spiral or rolled sheet(s), folded or crimped sheet(s), fiber array(s)), fabrication method (e.g., extrusion, casting from solution), presence or absence of a support layer, presence or absence of active layer (e.g., a porous prefilter to adsorb particles of a particular size, a reactive prefilter to remove impurities via chemical reaction or bonding), and the like. It is generally preferred that the membrane be from about 0.5 microns in thickness or less to 2000 microns in thickness or more, preferably from about 1, 5, 10, 25, 50, 100, 200, 300, 400, or 500 microns to about 600, 700, 800, 900, 1000, 1100, 1200, 1300, 1400, 1500, 1600, 1700, 1800 or 1900 microns. When thinner membranes are employed, it can be desirable to provide mechanical support to the membrane (e.g. by employing a supporting membrane, a screen or mesh, or other supporting structure), whereas thicker membranes may be suitable for use without a support. The surface area of the membrane can be selected based on the mass of vapor to be produced.

Membranes in fiber form are generally preferred over sheet form, due to their ability to provide greater exposed membrane surface area in a fixed volume when fibers are employed. Preferably, the membranes comprise hollow fibers, the fibers being fixed at each end in a header. The fibers are normally sealed at the lower end and open at their upper end to allow removal of vapor; however, in some arrangements, the fibers can be open at both ends to allow removal of vapor from one or both ends. Alternatively, source can be provided to the interior of the membrane fibers, and vapor removed from a space surrounding the exterior of the fibers.

Micro-Electronics Processing

The vaporizer devices of preferred embodiments are particularly well suited for use in delivering water vapor to micro-electronics processes. Water vapor is used, e.g., in rapid thermal processing (RTP), atomic layer deposition (ALD), plasma stripping, and diffusion. For ALD, RTP, and diffusion, water vapor is employed to grow oxides. Water is often generated in a pyrolitic process to ensure the purity of the water vapor. Difficulties with such pyrolitic processes include the need for combusting oxygen and hydrogen, the need for external torches on the diffusion chambers to prevent the 800° C. heat necessary for the pyrolitic process from changing the thermal profile of the tool, particulation of the torch tip, long startup and shut down times, safety issues associated with hydrogen use, and problems associated with excess hydrogen in the chamber. In addition, such systems have difficulty operating properly with very low flow rates or low water vapor to hydrogen ratios.

ALD requires very small amounts of water vapor for High K film formation. The purity of water vapor is critical for good film formation. Bubblers cannot control water vapor purity, and thus are unsuitable for use in ALD processes.

The vaporizer devices of preferred embodiments offer advantages over the conventional water vapor delivery methods used in RTP and ALD.

In plasma stripping, the process is more effective when water vapor is used to help lift the film of the wafer surface. The vaporizer devices of preferred embodiments can be employed to provide high flow rates of pure water vapor to a plasma stripping process in a controlled fashion. Lithography needs high flow rates of humid clean dry air. The vaporizer devices of preferred embodiments are capable of humidifying gas streams of up to and exceeding 1000 slm.

In order to produce high quality micro-electronics products, stringent control of humidity in the clean room containing fabrication devices is necessary. The humidity in micro-electronics (or medical) clean rooms requires very tight control of purity of the air. The humidity of the incoming air is conventionally controlled by injecting clean steam during cold and dry environmental conditions. If the steam contains contaminants, these contaminants are transferred into the air and into the clean rooms. This can detrimentally affect yield. Urea and chloroform are known contaminants that are carried in pure steam and are especially problematic in state of the art micro-electronics fabs. By using the vaporizer devices of preferred embodiments, humidity can be precisely controlled without transfer of contaminants into the air or clean room.

Vaporizer

The vaporizer devices of preferred embodiments can be configured to function as ultrapure humidifiers capable of meeting micro-electronics and other critical process requirements for delivery of water vapor and other low vapor pressure gases.

Preferably, the portions of the device in contact with vaporized carrier gas are constructed of either all fluoropolymer components, or fluoropolymer and 316L stainless steel components, depending on the application. The delivery flow rates for water vapor for the vaporizer device are typically from about 18 μgrams/min or less to about 1 kilogram/minute or more, depending on the intended application, the carrier gas employed, and the delivery pressure.

By adjusting the pressure within the vaporizer, the relative ratio between the vapor pressure and the carrier gas can be extended beyond atmospheric pressure ratios. Because the vapor pressure for a given liquid is fixed for a given temperature, raising or lowering the overall vapor pressure can change the ratio. For example, at 22° C. the vapor pressure of water is 0.0264 bar. At atmospheric pressure the molar ratio is 1:37.2 water vapor to carrier gas. At a vaporizer pressure of 10 bar the molar ratio is 1:377.8 and at a vacuum vaporizer pressure of 0.1 bar the molar ratio is 2.8:1. By independently controlling the pressure within the vaporizer and the downstream process pressure, precise control of the amount of low vapor pressure gas delivered can be achieved, even at different or varying process pressures, as long as the process pressures are less than the vaporizer operating pressure.

The vaporizer devices of preferred embodiments fully saturate the carrier gas with water vapor based on the temperature of the gas and liquid temperature set point, so as to accurately deliver water vapor. The non-porous membrane insures that only water vapor is added to the carrier gas. Microdroplets, dissolved gases, and most volatile contaminants are left behind in the source. The vaporizer device is particularly suited for the transfer of water, but is also suitable for use in transferring alcohols, ammonia hydroxide, or mixtures of liquid into a carrier gas.

When configured for operation as a humidifier, the devices of preferred embodiments are highly selective, and prevent most carrier gases from crossing over into the source. This allows for the safe use of gases that should otherwise be constrained from mixing with liquid water or IPA. It also limits the pressure the source container is subjected to during operation, since the pressure of the carrier gas does not significantly affect the pressure in the source container. This allows for vessels made from quartz to be used in the vaporizer device, whereas more robust materials would be required if employed in a bubbler.

When working with flammable chemicals such as hydrogen or IPA, metallic containment is often required by local safety codes. In the vaporizer devices of preferred embodiments, any metallic impurities that are picked up from the metal source container are prevented from contacting the carrier gas, thus providing improved safety and purity.

The vaporizer devices of preferred embodiments are configured for use over a variety of ambient conditions. With the addition of a back pressure regulation device, accurate delivery of low vapor pressure gases can be delivered into sub-atmospheric processes. Typical temperatures over which the device can operate include just above the freezing point of the liquid to the boiling point of the liquid at the selected operating pressure; however, it is generally preferred to limit the operating temperature to 120° C. when transferring water vapor. The thermal response and control of the vaporizer device are very fast, accurate, and capable of high vaporization rates by using thick or thin film resistive heating elements bonded directly to the quartz or stainless steel vaporizer housing. The fittings are selected based on the application, and typically include face seal, compression, flare or tube stub fittings. Such fittings are commercially available under the trademarks VCR®, SWAGELOK®, and FLARETEK®. In preferred embodiments, the vaporizer is constructed from either PFA (a polymer of tetrafluoroethylene and perfluorovinylether), polyvinylidene fluoride (PVDF), quartz, or stainless steel; however, other materials can also be suitable for use. In certain applications, it can be advantageous to supply the vaporizer device with heaters, coolers, and/or temperature controllers.

In certain application, it is not necessary or economically beneficial to fully saturate the carrier gas with the low vapor pressure gas. Because the membrane is diffusion limited and driven by the concentration gradient, a repeatable ratio of source to carrier gas can be generated for a given operating temperature and pressure.

For the vaporizer to function, the control of the addition of energy to maintain temperature is critical. The energy for the vaporizer can be added or removed in several different ways. The energy can be added or removed to either the source liquid through a commonly available gas heater or thermal control bath available from Neslab and others. The carrier gas or the entire vaporizer assembly can be immersed in a thermal bath or heated.

The control of the thermal energy added or subtracted can be controlled by monitoring the pressure of the head space above the liquid source to drive to a desired vapor pressure. Alternatively, at the outlet of the vaporizer and humidity detector (for water vapor) or temperature transducer for any type of carrier gas and vapor source can be used as feedback to the temperature controller to add or remove energy to the system.

In the vaporizer devices of preferred embodiments, it is generally preferred to flow both the source and the carrier gas from the bottom of the device and to exit from the top of the vaporizer device. This allows any condensation to be picked up by the carrier gas and, and thus limit condensation downstream of the vaporizer in case there is some cooling of the carrier gas after exit of the vaporizer. In addition, by running the flow for the source and carrier parallel instead of counter flow, the vaporizer can insure that both the source liquid and carrier gas are at vapor pressure equilibrium and have both reached set point.

In an alternative preferred embodiment, the carrier gas may flow counter current to the source liquid, offering the advantage that the exit temperature of the carrier gas can be at equilibrium to the source liquid supply temperature.

The systems and methods of preferred embodiments can be employed to deliver a mixture comprising carrier gas having a controlled concentration of water vapor. The carrier gas can be saturated with water vapor, or contain a concentration of water vapor below the saturation point, e.g., 90% 80%, 70%, 60%, 50%, 40%, 30%, 20%, 10%, 5%, or 1% or less of the saturation concentration at a specified temperature and pressure. The methods and systems can be employed to provide a carrier gas with water vapor at a high purity (e.g., with extremely low levels of added impurities such as aerosols, particles, gases other than water vapor (e.g. hydrogen, nitrogen, oxygen, carbon monoxide, carbon dioxide, hydrogen sulfide, hydrocarbons, and other volatile organic compounds), biological materials including mold, mold spores, viruses, prions, macromolecules, bacteria, metals, and ionic materials) from a water source of lesser purity.

The systems and methods of preferred embodiments can be employed to deliver source water vapor to the carrier gas having a purity of about 90% by weight or greater relative to the source liquid, such as a purity of at least about 91, 92, 93, 94, 95, 96, 97, 98, or 99% by weight, or a purity of at least about 99.1, 99.2, 99.3, 99.4, 99.5, 99.6, 99.7, 99.8, or 99.9% by weight, or a purity of at least about 99.91, 99.92, 99.93, 99.94, 99.95, 99.96, 99.97, 99.98, or 99.99% by weight, or a purity of at least 99.991, 99.992, 99.993, 99.994, 99.995, 99.996, 99.997, 99.998, or 99.999% by weight, or a purity of at least about 99.9991, 99.9992, 99.9993, 99.9994, 99.9995, 99.9996, 99.9997, 99.9998, or 99.9999% by weight.

In another embodiment, the source water vapor delivered to the carrier gas has a purity (i.e., a percent water content) of at least about 99.99999% by weight (100 ppb), a purity of at least 99.999999% by weight (10 ppb), a purity of at least 99.9999999% by weight (1 ppb), or a purity of at least 99.99999999% by weight (1 ppt).

Similar purity levels can be obtained for alcohol vapors (e.g., isopropyl alcohol, methanol, ethanol, and the like).

Experiments

Test 1

A vaporizer device was constructed for use as a humidifier, and the delivery flow rate of water was determined. The humidifier assembly consisted of seven 3.5R (3.5 thousand) lumens within a ¾" 304 stainless steel tube. The lumens were 28.2" long and were fitted with 1.1" long nylon sleeves. The exposed length of each membrane was 26". At both ends, the seven lumens were placed inside a sieve plate's holes. Both sieve plates were then swaged to ¾"×¼"×¾" bored out tees that were attached to each end of the ¾" stainless steel tube.

Figure 2:
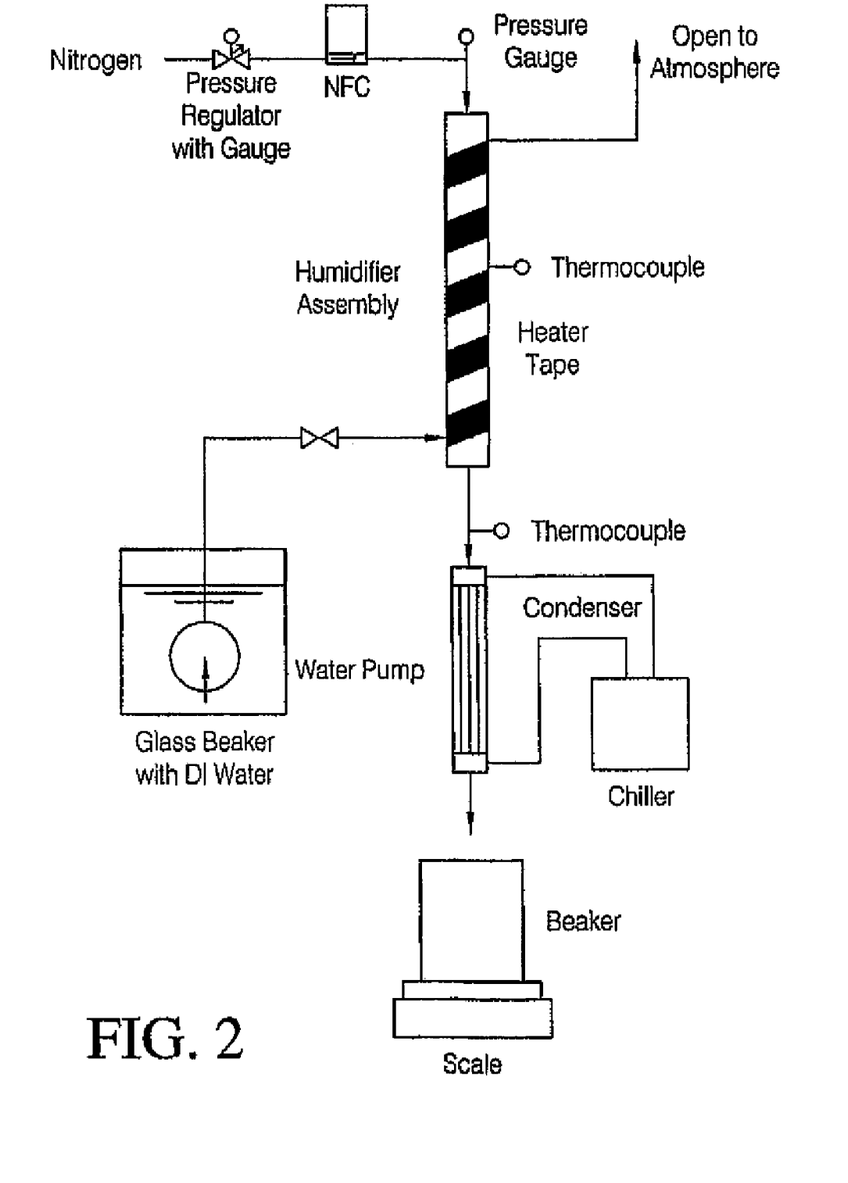
FIG. 2 is a schematic of the manifold used in an experiment involving a vaporizer device of a preferred embodiment.
Figure 3:
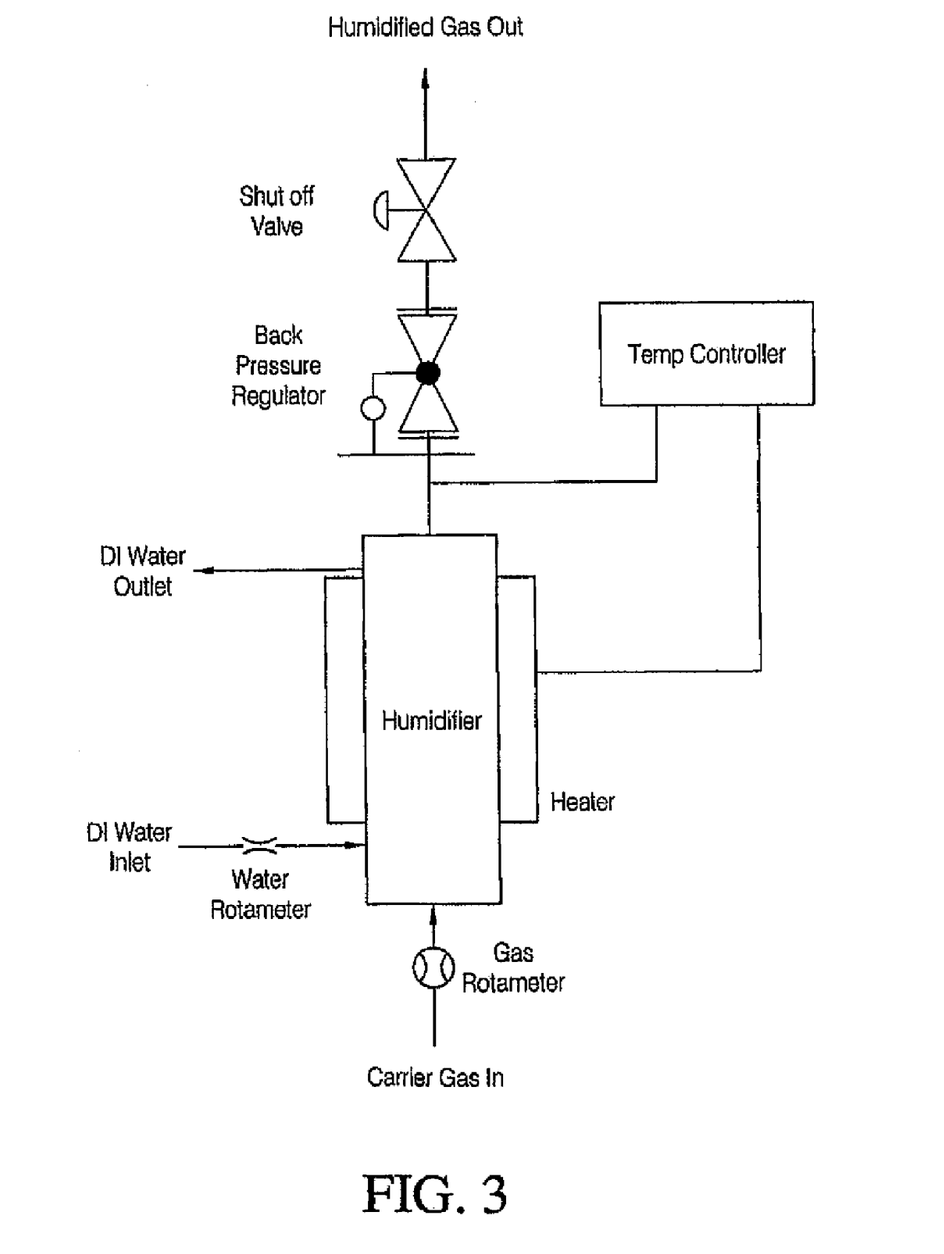
FIG. 3 is a schematic of a vaporizer system for use with liquid water.

FIG. 2 is a schematic of the manifold used in the experiment. The humidifier was in a vertical position throughout the test. The nitrogen flow rate was maintained at 3.0 slm with an Aera Flow Controller (MFC). A Porter PCIM4 Interface Module was used to control the MFC. A pressure gauge was placed upstream of the humidifier's gas inlet to monitor the pressure. The humidifier was wrapped in heater tape and insulation. A thermocouple was placed under the heater tape. The heater tape and thermocouple were connected to a temperature control box. The wet gas was sent through a condenser to covert the water back into a liquid state. The chiller was set for 5° C. The water from the wet gas was collected downstream of the condenser with a beaker. From the water captured, a scale was used to determine the delivery rate of water in grams per minute. On the shell side of the humidifier, de-ionized water was pumped from a glass beaker and into the humidifier with a Rio 800 pump. A Teflon tube was connected to the water outlet to watch the water level within the humidifier. Once the water was near the top of this Teflon tube, the valve upstream of the water pump was closed to hold the water at this level. Whenever the water reached the bottom of the Teflon tube, the valve was opened to fill the system again.

The highest temperature attained for the wet gas was 75.2° C., at which temperature the flow rate was measured. Flow rate measurements were taken in succession until the Teflon tube on the water outlet was empty. At this point, the system was filled with water and the flow rate readings were taken once the temperature was back above 73.0° C. again. Under these test conditions, eight readings were taken to obtain an average of 1.9 grams/minute with a gas flow at 3.0 slm and the water under static conditions. The wet gas temperature for these readings was from 73.0° C. to 75.2° C. at the thermocouple. A temperature drop from about 3.1° C. to 5.3° C. between the humidifier and the thermocouple was assumed. Throughout the test, the pressure upstream of the humidifier was not measured beyond the zero range of the pressure gauge.

The highest temperature attained for the wet gas was 75.2° C., at which temperature the flow rate was measured. Flow rate measurements were taken in succession until the Teflon tube on the water outlet was empty. At this point, the system was filled with water and the flow rate readings were taken once the temperature was back above 73.0° C. again. Under these test conditions, eight readings were taken to obtain an average of 1.9 grams/minute with a gas flow at 3.0 slm and the water under static conditions. The wet gas temperature for these readings was from 73.0° C. to 75.2° C. Throughout the test, the pressure upstream of the humidifier was not measured beyond the zero range of the pressure gauge.

A calculation was made to determine the ideal amount of water within the gas stream under the specified conditions. Equation 1 is the Goff-Gratch equation:

$$\mathrm{Log}_{10} p_w = -7.90298(373.16/T-1) + 5.02808 \times \mathrm{Log}_{10}(373.16/T) - 1.3816 \times 10^{-7}(10^{11.344(1-T/373.16)} - 1) + 8.1328 \times 10^{-3}(10^{-3.49149(373.16/T-1)} - 1) + \mathrm{Log}_{10}(1013.246)$$ (Equation 1)

(with T in [K] and $p_w$ in [hPa])

Using this equation, the saturation vapor pressure of water can be calculated at temperatures greater than 0° C. Assuming that the wet gas stream was completely saturated, the water vapor pressure would have been from 0.354 to 0.389 bar at temperatures of 73.0° C. and 75.2° C., respectively. With the assumption that the pressure within the humidifier was at 1.01325 bar, the partial pressure for the nitrogen would have been between 0.624 and 0.659 bar. If the initial flow of nitrogen is divided by the pressure ratio, the total flow of nitrogen and water would have been between 4.6 and 4.9 slm. From the water pressure ratio, the flow rate of water would be calculated to be between 1.6 and 1.9 slm. Assuming ideal conditions, the water flow would have been 1.3 to 1.5 grams/minute. The result of 1.9 grams/minute as measured corresponds to a water delivery rate that is not possible for the nitrogen gas to carry under these assumed experimental conditions; however, it is believed that there was heat loss from the humidifier to the thermocouple. Therefore, the temperature that was measured would not represent the exact temperature within the humidifier. By calculating backwards, the temperature in the humidifier would have to have been 78.3° C. to reach a flow rate of 1.9 grams/minute. Accordingly, it was concluded that a temperature drop between 3.1 and 5.3° C. occurred between the humidifier and the thermocouple. The data thus show that excellent water flow rates for the vaporizer device were obtained that approached those observed for ideal conditions.

Test 2

A single 5R (5 thousand) lumen was built into a humidifier assembly. The lumen was inserted into a 02.5" ID PFA tube. A 100 watt heater was wrapped around the assembly, which was then insulated. A thermocouple was mounted downstream of the humidifier assembly. A calibrated water column was used to measure water used over time. The carrier gas was nitrogen, and flow of nitrogen was controlled by a digital thermal mass flow controller. The flow and temperature were allowed to stabilize, and then data was collected for three flow rates: 1 slm, 5 slm, and 10 slm. The amount of water used was compared to the ideal case based on the vapor pressure of water at the measured downstream gas temperature.

Figure 4:
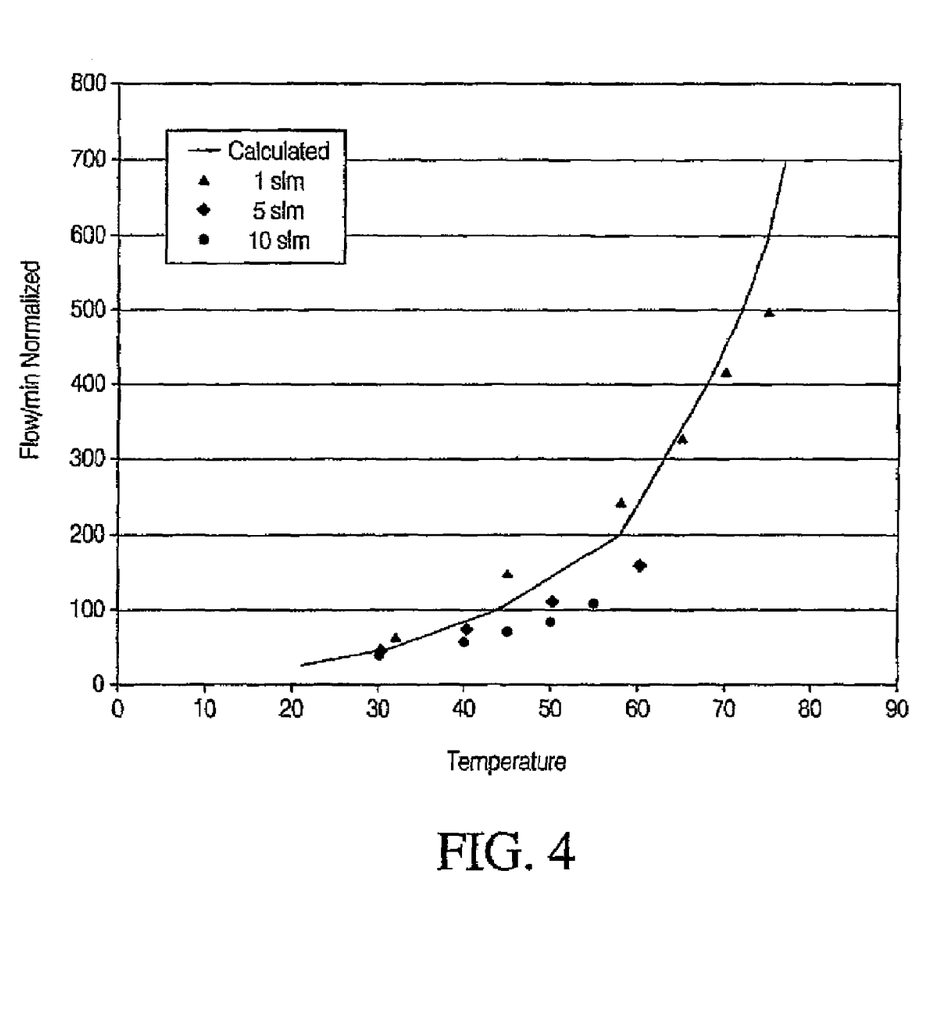
FIG. 4 provides graphical results of a vaporizer operated at different flow rates.

As demonstrated by the flow and temperature data, as presented in FIG. 4, the membrane mass transfer rate limits the ultimate amount of water vapor that can be added to the carrier gas. As the carrier gas flow rate increased, the difference between the fully saturated state and the actual state increases. The difference between fully saturated and partial loading can be calibrated and used to control delivery of the vapor.

All references cited herein, including but not limited to published and unpublished applications, patents, and literature references, are incorporated herein by reference in their entirety and are hereby made a part of this specification. To the extent publications and patents or patent applications incorporated by reference contradict the disclosure contained in the specification, the specification is intended to supersede and/or take precedence over any such contradictory material.

The term "comprising" as used herein is synonymous with "including," "containing," or "characterized by," and is inclusive or open-ended and does not exclude additional, unrecited elements or method steps.

All numbers expressing quantities of ingredients, reaction conditions, and so forth used in the specification are to be understood as being modified in all instances by the term "about." Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

The above description discloses several methods and materials of the present invention. This invention is susceptible to modifications in the methods and materials, as well as alterations in the fabrication methods and equipment. Such modifications will become apparent to those skilled in the art from a consideration of this disclosure or practice of the invention disclosed herein. Consequently, it is not intended that this invention be limited to the specific embodiments disclosed herein, but that it cover all modifications and alternatives coming within the true scope and spirit of the invention.

What is claimed is:

1. A vaporizer device, the device comprising:
   a mass flow control device configured to control a flow rate of a carrier gas; and
   a vaporizer, wherein the vaporizer comprises:
      a source configured to provide a liquid,
      at least one temperature controller configured to control a temperature of at least one of the liquid and the carrier gas, and
      a membrane assembly configured to permit passage therethrough of the liquid but not the carrier gas, whereby the liquid passes through the membrane assembly to contact the carrier gas, thereby yielding a mixture of vapor in the carrier gas, wherein a concentration of the vapor in the carrier gas is determined by the temperature of the liquid, the temperature of the carrier gas, and the flow rate of the carrier gas.

2. The vaporizer device of claim 1, wherein the source comprises a chamber, the source further comprising a level detection device configured to monitor an amount of liquid in the chamber.

3. The vaporizer device of claim 1, further comprising a pressure transducer configured to provide a feedback to the temperature controller.

4. The vaporizer device of claim 1, further comprising a temperature transducer configured to provide a feedback to the temperature controller.

5. The vaporizer device of claim 1, further comprising a humidity transducer configured to provide a feedback to the temperature controller.

6. The vaporizer device of claim 1, further comprising a downstream pressure control device configured to control a pressure of the mixture of vapor in the carrier gas.

7. The vaporizer device of claim 1, further comprising a thermal control device.

8. The vaporizer device of claim 7, further comprising a thermal control device, wherein the thermal control device is configured to perform at least one of adding heat to the liquid and removing heat from the liquid.

9. The vaporizer device of claim 8, further comprising a thermal control device, wherein the thermal control device is configured to perform at least one of adding heat to the carrier gas and removing heat from the carrier gas.

10. The vaporizer device of claim 1, further comprising a downstream pressure control device configured to control a ratio of vapor to carrier gas in the mixture.

11. The vaporizer device of claim 1, further comprising a downstream pressure control device configured to deliver the mixture into a sub-atmospheric process.

12. The vaporizer device of claim 1, wherein the membrane assembly comprises an ionic membrane, wherein the ionic membrane is configured to inhibit passage therethrough of at least one contaminant present in the liquid.

13. The vaporizer device of claim 1, wherein the membrane assembly comprises an ion exchange membrane comprising a perfluorinated ionomer.

14. The vaporizer device of claim 1, wherein the membrane assembly comprises a fluoropolymer membrane containing sulfonic acid groups.

15. The vaporizer device of claim 1, wherein the membrane assembly comprises a substantially gas-impermeable membrane having a leak rate of gases other than water vapor of less than about $10^{-3}$ $cm^3/cm^2/s$ under standard atmosphere and pressure.

16. The vaporizer device of claim 1, wherein the vaporizer is configured to deliver vapor to the carrier gas at a controlled rate of from about 18 micrograms per minute to about 1 kilogram per minute.

17. The vaporizer device of claim 1, wherein the carrier gas comprises a gas selected from the group consisting of hydrogen, oxygen, nitrogen, helium, argon, ozone, carbon dioxide, carbon monoxide, air, and mixtures thereof.

18. The vaporizer device of claim 1, wherein the liquid is selected from the group consisting of water, liquid alcohol, liquid amine, and mixtures thereof.

19. A method for producing a mixture of a vapor in a carrier gas, the method comprising:

contacting a source liquid at a preselected first temperature with a first side of a membrane, wherein the membrane permits the passage therethrough of the liquid;

contacting a carrier gas at a preselected second temperature and a preselected flow rate with a second side of the membrane, wherein the membrane resists passage therethrough of the carrier gas; and contacting, at the second side of the membrane, the carrier gas with liquid that has passed through the membrane, whereby a mixture of a source vapor at a preselected concentration in the carrier gas is generated.

20. The method of claim 19, wherein the carrier gas comprises a gas selected from the group consisting of hydrogen, oxygen, nitrogen, helium, argon, ozone, carbon dioxide, carbon monoxide, air, and mixtures thereof.

21. The method of claim 19, wherein the carrier gas is selected from the group consisting of a corrosive gas, a reactive gas, a hydrocarbon gas, a halogenated gas, and mixtures thereof.

22. The method of claim 19 wherein the source liquid is selected from the group consisting of water, liquid alcohol, liquid amine, and mixtures thereof.

23. The method of claim 19, wherein the carrier gas is clean air, and wherein the source vapor comprises water, and wherein water vapor in the carrier gas contains less than about 1 ppb of prions, viruses, allergens, proteins, bacteria, and other biologically active macromolecules.

24. The method of claim 19, wherein a rate of delivery of vapor to the carrier gas is from about 18 micrograms to about 1 kilogram per minute.

25. The method of claim 19, further comprising a step of delivering the mixture of the source vapor at the preselected concentration in the carrier gas into a sub-atmospheric process.

26. The method of claim 19, where the liquid source is water vapor for use in manufacture of micro-electronics.

* * * * *

UNITED STATES PATENT AND TRADEMARK OFFICE
CERTIFICATE OF CORRECTION

PATENT NO. : 7,618,027 B2  
APPLICATION NO. : 12/198755  
DATED : November 17, 2009  
INVENTOR(S) : Jeffrey J. Spiegelman It is certified that error appears in the above-identified patent and that said Letters Patent is hereby corrected as shown below:

At Column 1, Line 13, after "filed" insert --on--.

At Column 1, Line 32, change "e.g." to --e.g.,--.

At Column 1, Line 33, change "(e.g." to --(e.g.,--.

At Column 1, Line 42, change "e.g." to --e.g.,--.

At Column 5, Lines 43-44, change "fluoroxene," to --fluroxene,--.

At Column 6, Line 62, change "(e.g." to --(e.g.,--.

At Column 7, Line 33, change "e.g." to --e.g.,--.

At Column 7, Line 36, change "e.g." to --e.g.,--.

At Column 7, Line 39, change "e.g." to --e.g.,--.

At Column 7, Line 45, change "e.g." to --e.g.,--.

At Column 7, Line 60, change "e.g." to --e.g.,--.

At Column 7, Line 63, change "(e.g." to --(e.g.,--.

At Column 8, Line 2, change "tetraafluoroethylene" to --tetrafluoroethylene--.

At Column 8, Lines 10-27 (Approx.), change

Signed and Sealed this

Twenty-third Day of November, 2010

David J. Kappos  
*Director of the United States Patent and Trademark Office*

CERTIFICATE OF CORRECTION (continued)
U.S. Pat. No. 7,618,027 B2 to

At Column 8, Line 49, change "(e.g." to --(e.g.,--.

At Column 8, Line 56, change "e.g." to --e.g.,--.

At Column 8, Line 60 to Column 9, Line 12 (Approx.), change

"                                                                                              "

to

At Column 9, Line 23, change "(e.g." to --(e.g.,--.

At Column 9, Line 28, change "(e.g." to --(e.g.,--.

At Column 9, Line 32, change "(e.g." to --(e.g.,--.

CERTIFICATE OF CORRECTION (continued)
U.S. Pat. No. 7,618,027 B2

At Column 10, Line 11, change "(e.g." to --(e.g.,--.

At Column 10, Line 26, change "(e.g." to --(e.g.,--.

At Column 10, Line 50, change "pyrolitic" to --pyrolytic--.

At Column 10, Line 51, change "pyrolitic" to --pyrolytic--.

At Column 10, Line 54, change "pyrolitic" to --pyrolytic--.

At Column 13, Line 18, change "(e.g." to --(e.g.,--.

At Column 13, Line 61, change "Aera" to --Mass--.

At Column 14, Line 45 (Approx.), change "$1.3816\ 10^{-7}$" to --$1.3816 \times 10^{-7}$--.

At Column 18, Line 5, Claim 22, change "claim 19" to --claim 19,--.